United States Patent [19]

Zamanian

[11] Patent Number: 5,171,700
[45] Date of Patent: Dec. 15, 1992

[54] FIELD EFFECT TRANSISTOR STRUCTURE AND METHOD

[75] Inventor: Mehdi Zamanian, Carrollton, Tex.

[73] Assignee: SGS-Thomson Microelectronics, Inc., Carrollton, Tex.

[21] Appl. No.: 678,018

[22] Filed: Apr. 1, 1991

[51] Int. Cl.⁵ .......................................... H01L 21/265
[52] U.S. Cl. ...................................... 437/44; 437/40; 437/45; 437/46
[58] Field of Search ...................... 437/44, 45, 41, 40, 437/46

[56] References Cited

U.S. PATENT DOCUMENTS

| | | | |
|---|---|---|---|
| 4,746,624 | 5/1988 | Cham et al. | 437/44 |
| 4,906,589 | 3/1990 | Chao | 437/44 |
| 4,925,807 | 5/1990 | Yoshikawa | 437/44 |
| 4,968,639 | 11/1990 | Bergonzoni | 437/45 |
| 5,015,599 | 5/1991 | Verhaar | 437/44 |
| 5,032,530 | 7/1991 | Lowrey et al. | 437/41 |

Primary Examiner—Brian E. Hearn
Assistant Examiner—Kevin M. Picardat
Attorney, Agent, or Firm—Kenneth C. Hill; Lisa K. Jorgenson; Richard K. Robinson

[57] ABSTRACT

After formation of gate electrodes in a field effect device, first lightly doped drain regions, and opposite contactivity type halo regions, are formed by implant into the substrate. A first thin oxide layer is then formed over the device, followed by an implant of a second lightly doped drain region. The second lightly doped drain region will be spaced further from the channel of the field effect device than the first lightly doped drain region by the thickness of the thin oxide layer. A second oxide layer is then formed over the device, followed by an anisotropic etch back to form sidewall regions alongside the gate electrode of the device. The sidewall regions are used to align the heavy impurity implant for forming source/drain regions.

17 Claims, 1 Drawing Sheet

FIELD EFFECT TRANSISTOR STRUCTURE AND METHOD

BACKGROUND OF THE INVENTION

1. Field of the Invention

The present invention relates generally to semiconductor integrated circuits, and more specifically to a method for forming field effect devices in a semiconductor substrate.

2. Description of the Prior Art

To increase the number of devices which can be fabricated on a single integrated circuit chip, lower the cost of integrated circuit devices, and improve performance, transistors continue to be made smaller. For feature sizes less than approximately one micron, especially for sizes of approximately one-half micron and below, a number of performance problems are encountered due to the physics of semiconductors and small transistor sizes.

As known in the art, short channel effects degrade transistor performance. In order to counter these degradations, it is known in the art to form lightly doped drain (LDD) regions between the transistor channel and the more heavily doped source/drain regions. This provides a more lightly doped, graded, impurity region near the edges of the gate, decreasing the impact of problems such as the hot electron effect.

With device feature sizes greater than approximately one micron, up, later thermal processing cycles cause some diffusion of the implanted lightly doped drain region. This diffusion provides an impurity gradient which helps minimize the effect of high electric fields and enhances device performance.

With smaller geometries, such as one-half micron and below, later thermal cycles are minimized. The thermal budget allowed for very small feature size devices must be decreased because the source/drain junctions must be shallower than is the case with larger devices. A lower thermal budget means that the lightly doped drain regions diffuse to a lesser degree than is the case with larger devices, and this lesser diffusion does not provide the same LDD gradient profile as occurs with larger devices. Thus, with smaller devices, a sharper gradient occurs near the channel, which means that higher electric fields still occur in this region. The shorter channel used with smaller geometry devices also tends to increase the electric field gradient, further exacerbating the problem.

It is known in the art to provide lightly doped drain regions having multiple steps of impurity levels. For example, U.S. Pat. No. 4,356,623, issued Nov. 2, 1982 to W. R. Hunter, describes a technique for fabricating field effect devices which have stepped lightly doped drain regions. These are formed by forming, in succession, multiple sidewall regions on the gate electrodes, followed by impurity implants after each layer of sidewall formation. Formation of multiple sidewalls in this manner, and the attendant damage to the gate and to underlying structures caused by multiple anisotropic etch back steps, can have an adverse impact on device functionality.

It would be desirable to provide a method for fabricating very small transistors which provides graded impurity density in the lightly doped drain regions. It would be further desirable for such method to be simple to perform and to provide a highly functional device.

SUMMARY OF THE INVENTION

It is therefore an object of the present invention to provide a method for forming semiconductor field effect devices, and to provide a structure formed by such method.

It is another object of the present invention to provide such a structure and method which provides lightly doped drain regions suitable for use with very small device feature sizes.

It is a further object of the present invention to provide such a structure and method which adds a minimal amount of complexity to the device fabrication process.

Therefore, according to the present invention, after formation of gate electrodes in a field effect device, first lightly doped drain regions, and opposite contactivity type halo regions, are formed by implant into the substrate. A first thin oxide layer is then formed over the device, followed by an implant of a second lightly doped drain region. The second lightly doped drain region will be spaced further from the channel of the field effect device than the first lightly doped drain region by the thickness of the thin oxide layer. A second oxide layer is then formed over the device, followed by an anisotropic etch back to form sidewall regions alongside the gate electrode of the device. The sidewall regions are used to align the heavy impurity implant for forming source/drain regions

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
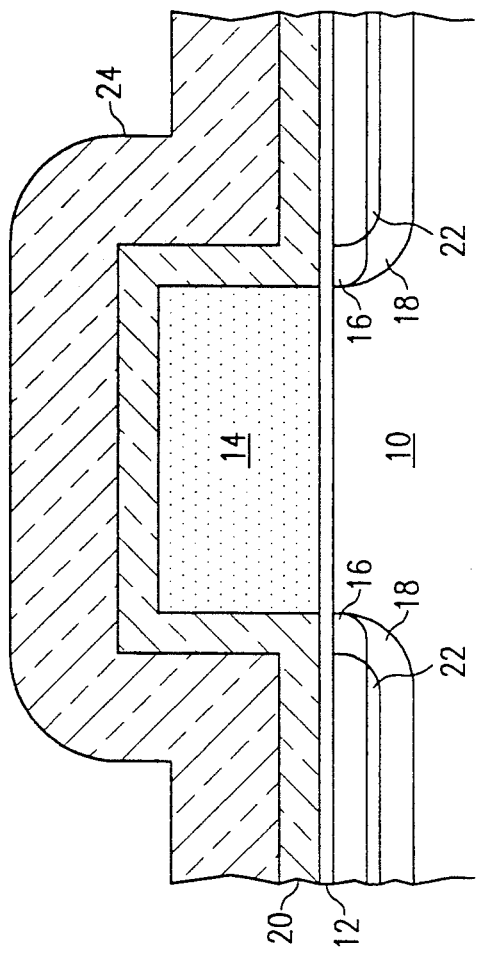
FIGS. 1-4 illustrate a preferred method for forming a field effect transistor according to the present invention.

Referring to FIG. 1, a field effect transistor is to be formed in a semiconductor substrate 10. Assuming the formation of an N-channel transistor, substrate 10 will be doped P-type. After formation of field oxide regions (not shown) to define active regions in the substrate 10, a thin gate oxide 12 is grown over the surface of the substrate 10. This is followed by deposition of a polycrystalline silicon layer 14 over the device, which is subsequently patterned to define gate electrodes as shown in FIG. 1. As known in the art, gate electrode 14 may be polycrystalline silicon which is highly doped to improve its conductivity, or it may be a polycrystalline silicon which has been silicided with a refractory metal such as tantalum or tungsten.

After the gate electrode 14 has been patterned, a light (N$^{--}$) implant is made to define first lightly doped drain regions 16. This is followed by formation of P-type halo regions 18, which are implanted to a greater depth than the N$^{--}$ lightly doped drain regions 16.

Halo regions 18 are formed by implanting a P-type impurity (for an N-channel transistor) at a dosage (P$^-$) which is slightly higher than that used for the formation of the first lightly doped drain region 16. Formation of the halo regions 18 helps improve the device's punch-through and $V_T$ roll off characteristics. If desired, the implant of the halo regions 18 can be performed before formation of the N$^{--}$ lightly doped drain regions 16.

Figure 2:
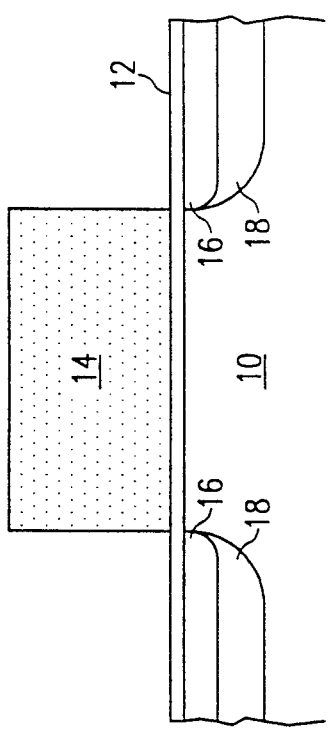

Referring to FIG. 2, an oxide layer 20 is formed over the device. This oxide layer 20 is preferably an undoped CVD oxide, which is deposited to a thickness of between approximately 500 and 1200 angstroms. In the alternative, the layer 20 could be grown. Following formation of the oxide layer 20, an N-type impurity is again implanted into the substrate 10 to form second (N$^-$) lightly doped drain regions 22. This implant is made at a higher impurity level than that which is used to form first lightly doped drain region 16.

If desired, an additional P$^-$ halo implant can be made at this point in the process. Such halo implant may be made either before or after the implant which forms the second (N$^-$) lightly doped drain regions 22. The effect of the second halo implant is to provide a step graded halo in the same manner that a step graded lightly doped drain is formed by the regions 16 and 22.

Figure 3:
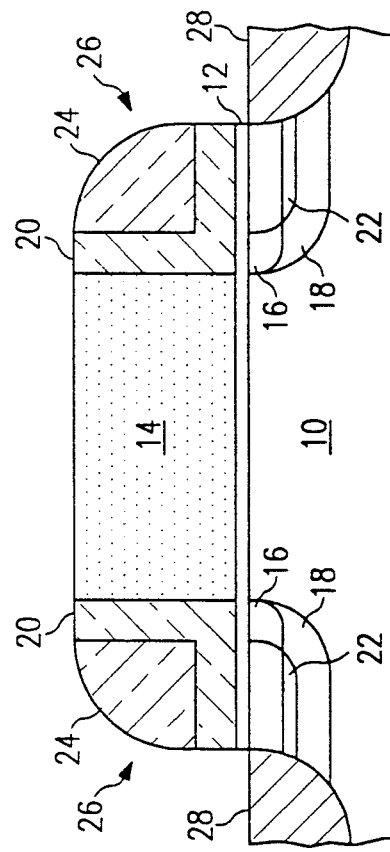

Referring to FIG. 3, a second oxide layer 24 is formed over the device, again preferably using a CVD oxide. Oxide layer 24 is preferably formed to a thickness between approximately 2500 to 3500 angstroms.

Figure 4:
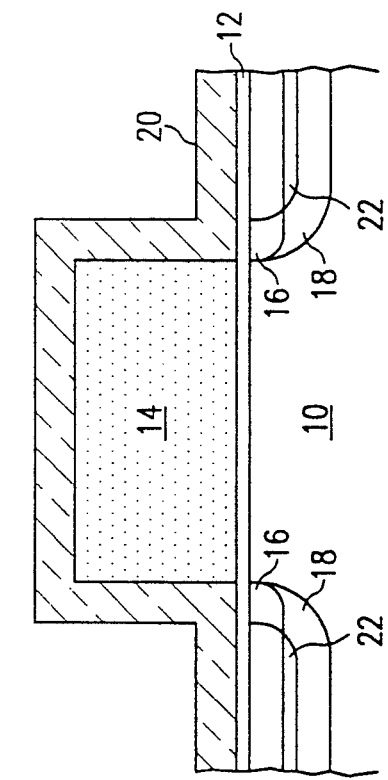

Referring to FIG. 4, an anisotropic etch is used to remove portions of oxide layers 12, 20, and 24. This results in the formation of sidewall oxide spacers 26, with each of the spacers 26 being formed from portions of the oxide layers 12, 20, and 24. Following formation of the oxide spacers 26, a heavy N-type implant is made in the device to form source/drain regions 28. This results in the structure shown in FIG. 4. Later process steps, including formation of interlevel oxides, formation of polycrystalline silicon and metal interconnect layers, and device passivation, are performed as known in the art.

It will be appreciated by those skilled in the art that the junctions at the edges of the implanted regions 16, 18, 22, 28, will migrate from the positions shown in FIG. 4 during later thermal cycles. However, they will tend to keep approximately the relative positions shown in FIG. 4.

The doping concentrations used for the various regions described above will be chosen to be compatible with the user's process flow. By way of example, preferred concentrations can be approximately 5–7 E12 atoms/cm$^3$ for the N$^{--}$ regions, 3 E13 atoms/cm$^3$ for the N$^-$ regions, and 1 E13 atoms/cm$^3$ for the halo regions. These concentrations can be varied to suit the requirements of the process which is used, and the device being fabricated.

The method described above produces a lightly doped drain region having a very lightly doped portion adjacent to the channel of the device, with a more moderately doped region between the very lightly doped region and the source/drain region. Thus, implantation steps have been used to approximate a graded lightly doped drain region to replace the diffusion gradient which occurs in the prior art to the lightly doped drain region during later thermal cycles. A P-type halo has been included with the step graded lightly doped drain region in order to prevent punch through and improve $V_T$ roll off characteristics for the device.

The described example has illustrated the formation of an N-channel field effect transistor on a P-type substrate. As known in the art, such a transistor may also be formed within a P-type tub region within an N-type substrate. The described techniques can also be used, if desired, to form enhancement mode P-channel field effect transistors in an N-type substrate or tub. Formation of a P-channel device simply involves changing the impurities introducted at the various steps.

While the invention has been particularly shown and described with reference to a preferred embodiment, it will be understood by those skilled in the art that various changes in form and detail may be made therein without departing from the spirit and scope of the invention.

What is claimed is:

1. A method for forming a semiconductor field effect device, comprising the steps of:

forming a conductive gate electrode over a semiconductor substrate having a first conductivity type, wherein the gate electrode has the same thickness throughout;

implanting impurities having a second conductivity type into the substrate using the gate electrode as an implant mask, wherein first lightly doped drain regions are formed in the substrate adjacent the gate electrode;

forming a conformal first insulating layer over the substrate and the gate electrode, wherein the first insulating layer has a first selected thickness;

implanting impurities having the second conductivity type into the substrate using as a mask the gate electrode and portions of the first insulating layer adjacent to vertical sidewalls thereof, wherein second lightly doped drain regions are formed adjacent the first lightly doped drain regions and spaced from the gate electrode by a distance substantially equal to the first selected thickness, and wherein the second lightly doped drain regions have an impurity concentration greater than the first lightly doped drain regions;

forming a second insulating layer over the first insulating layer, such second insulating layer having a second selected thickness;

anisotropically etching back the first and second insulating layers to expose portions of the substrate proximate the gate electrode, and to form sidewall insulator, regions alongside the gate electrode, wherein the sidewall insulator regions have a width approximately equal to the sum of the first and second selected thicknesses; and implanting impurities of the second conductivity type into the substrate to form source/drain regions using the gate electrode and the sidewall insulator regions as a mask, whereby the source/drain regions are spaced from the gate electrode by the width of the sidewall insulator regions.

2. The method of claim 1, wherein said gate electrode forming step comprises the steps of:

forming a gate insulating layer over the substrate;

forming a layer of polycrystalline silicon over the gate insulating layer; and patterning the polycrystalline silicon layer to define a gate electrode;

wherein the gate insulating layer lies between &he substrate and portions of the first insulating layer which overly the substrate.

3. The method of claim 2, further comprising the step of:

prior to said patterning step, forming a layer of refractory metal silicide in the polycrystalline silicon layer.

4. The method of claim 1, wherein the first conductivity type is P-type, and the second conductivity type is N-type.

5. The method of claim 1, wherein the first conductivity type is N-type, and the second conductivity type is P-type.

6. The method of claim 1, further comprising the step of:

after said electrode forming step, implanting impurities of the first conductivity type to form first halo regions adjacent the gate electrode in the substrate.

7. The method of claim 6, wherein said first halo region forming step is performed before said first lightly doped drain forming step.

8. The method of claim 6, wherein said first halo region forming step is performed after said first lightly doped drain forming step.

9. The method of claim 6, further comprising the step of:

after said first insulating layer forming step, implanting impurities of the first conductivity type to form second halo regions adjacent the first halo regions.

10. The method of claim 9, wherein said second halo region forming step is performed before said second lightly doped drain forming step.

11. The method of claim 6, wherein said second halo region forming step is performed after said second lightly doped drain forming step.

12. The method of claim 1, further comprising the step of:

prior to said second insulating layer forming step, implanting impurities of the first impurity type to form halo regions in the substrate adjacent the second lightly doped drain regions.

13. The method of claim 1, wherein the first and second insulating layers are formed of silicon dioxide.

14. A method for forming a semiconductor field effect device, comprising the steps of:

forming a gate oxide layer over a substrate having a first conductivity type;

forming a conductive layer containing polycrystalline silicon over the gate oxide layer;

patterning the conductive layer to define a gate electrode, wherein the gate electrode has the same thickness throughout;

implanting impurities having a second conductivity type into the substrate using the gate electrode as an implant mask, wherein first lightly doped drain regions are formed in the substrate adjacent the gate electrode;

forming a conformal first insulating layer over the gate oxide layer and the gate electrode, wherein the first insulating layer has a first selected thickness;

implanting impurities having the second conductivity type into the substrate using as a mask the gate electrode and portions of the first insulating layer adjacent to vertical sidewalls thereof, wherein second lightly doped drain regions are formed adjacent the first lightly doped drain regions and spaced from the gate electrode by a distance substantially equal to the first selected thickness, and wherein the second lightly doped drain regions have an impurity concentration greater than the first lightly doped drain regions;

forming a second insulating layer over the first insulating layer, such second insulating layer having a second selected thickness;

anisotropically etching back the first and second insulating layers to expose portions of the substrate proximate the gate electrode, and to form sidewall insulator regions alongside the gate electrode, wherein the sidewall insulator regions have a width approximately equal to the sum of the first and second selected thicknesses; and implanting impurities of the second conductivity type into the substrate to form source/drain regions using the gate electrode and the sidewall insulator regions as a mask, whereby the source/drain regions are spaced from the gate electrode by the width of the sidewall insulator regions.

15. The method of claim 14, further comprising the step of:

before said first insulating layer forming step, implanting impurities having the first conductivity type into the substrate to a depth greater than that used for the first lightly doped drain regions to form halo regions.

16. The method of claim 15, further comprising the step of:

before said second insulating layer forming step, implanting impurities having the first conductivity type into the substrate to a depth greater than that used for the second lightly doped drain regions to form second halo regions.

17. The method of claim 14, further comprising the step of:

before said second insulating layer forming step, implanting impurities having the first conductivity type into the substrate to a depth greater than that used for the second lightly doped drain regions to form halo regions.

* * * * *